United States Patent [19]

Schnizlein et al.

[11] Patent Number: 4,691,122
[45] Date of Patent: Sep. 1, 1987

[54] CMOS D-TYPE FLIP-FLOP CIRCUITS

[75] Inventors: Paul G. Schnizlein; Wen-Tsung F. Tang, both of Austin, Tex.

[73] Assignee: Advanced Micro Devices, Inc., Sunnyvale, Calif.

[21] Appl. No.: 717,350

[22] Filed: Mar. 29, 1985

[51] Int. Cl.[4] .................. H03K 3/26; H03K 17/16; H03K 19/096; H03K 3/284

[52] U.S. Cl. ..................... 307/279; 307/443; 307/243; 307/452; 307/481; 307/269; 307/272 A; 377/80

[58] Field of Search ............... 307/443, 243, 452, 481, 307/269, 272 A, 279; 377/74, 78–80

[56] References Cited

U.S. PATENT DOCUMENTS

| | | | |
|---|---|---|---|
| 4,356,411 | 10/1982 | Suzuki et al. | 307/272 A |
| 4,409,671 | 10/1983 | Daniels et al. | 307/269 |
| 4,484,087 | 11/1984 | Mazin et al. | 377/79 |
| 4,551,634 | 11/1985 | Takahashi et al. | 307/245 |
| 4,598,214 | 7/1986 | Sexton | 307/453 |

OTHER PUBLICATIONS

I.B.M. Tech. Dis. Bul., "Non–Overlapping Clocks for Master–Slave Latch", Hatchett.

Primary Examiner—Stanley D. Miller
Assistant Examiner—M. R. Wambach
Attorney, Agent, or Firm—Patrick T. King; Davis Chin

[57] ABSTRACT

A CMOS D-type flip-flop circuit stage for avoiding the possibilty of feedthrough includes a non-overlapping clock generator section having a true clock output and a complement clock output. The flip-flop circuit includes a master section formed of a first transfer gate, a first regenerative transistor and a first inverter gate. The flip-flop circuit further includes a slave section formed of a second transfer gate, a second regenerative transistor and a second inverter gate. The clock generator provides a two-phase non-overlapping clock for clocking both the master and slave sections so as to prevent inadvertent racethrough of data input to successive stages.

8 Claims, 16 Drawing Figures

CMOS D-TYPE FLIP-FLOP CIRCUITS

BACKGROUND OF THE INVENTION

This invention relates generally to logic circuits and more particularly, it relates to complementary metal-oxide semiconductor (CMOS) circuit design of storage devices such as flip-flops, data shift registers, memory elements and the like. Most especially, it relates to a CMOS D-type flip-flop circuit stage having a single N-channel field-effect transistor (FET) for data transfer in a master section and in a slave section. This permits the use of a two-phase non-overlapping clock generator for clocking both the master and slave sections so as to prevent inadvertent racethrough of data input to successive stages.

A CMOS D-type dynamic flip-flop circuit of the prior art is shown in FIG. 1 which requires both a N-channel MOS transistor T1 and a P-channel MOS transistor T2 in the master section and in the slave section. Due to this, a non-overlapping clock generator could not be used since the flip-flop circuit would be susceptible to the problem of feedthrough or racethrough. In another words, both of the P-channel transistors T2 would be partially turned on simultaneously whereby the data input would feed through to the successive stages. Thus, this prior art flip-flop circuit required the use of a specially-designed clock to insure proper transition time relative to the inverter delay. Further, this prior art circuit necessitated the routing of two lines to successive stages. In order to eliminate the routing of two lines, a flip-flop circuit of the prior art was constructed as shown in FIG. 2. However, the circuit of FIG. 2 required the use of an additional inverter gate I1 which increased its cost for manufacturing.

A CMOS D-type static flip-flop circuit of the prior art is shown in FIG. 3. This circuit is similar to the dynamic flip-flop circuit of FIG. 1 and requires the addition of a regeneration circuit formed of a N-channel MOS transistor T3, a P-channel MOS transistor T4 and an inverter gate I2 in both the master section and the slave section. The circuit of FIG. 3 suffered from the same disadvantages of FIG. 1 in that racethrough would occur if a non-overlapping clock generator was used. In order to solve the problem of racethrough, a flip-flop circuit of the prior art was constructed as shown in FIG. 4. However, the circuit of FIG. 4 required the generating and routing of four lines. Furthermore, there was needed to generate separate clock pulses providing true and false clock phases to the master section which differed from true and false clock phases supplied to the slave section. The problem of racethrough was overcome by delaying the clock pulses to the slave section relative to the clock pulses applied to the master section. A clock generator which accomplished this result is illustrated in FIG. 5.

It would therefore be desirable to provide CMOS D-type flip-flop circuits which are immune to the possibility of racethrough but is capable of utilizing a standard or conventional non-overlapping clock generator.

SUMMARY OF THE INVENTION

Accordingly, it is a general object of the present invention to provide CMOS D-type flip-flop circuits which avoid the possibility of racethrough.

It is an object of the present invention to provide a CMOS D-type flip-flop circuit stage which permit the use of a two-phase non-overlapping clock generator for clocking both the master and slave sections so as to prevent inadvertent racethrough of data input to successive stages.

It is another object of the present invention to provide a CMOS D-type flip-flop circuit having a single N-channel MOS transistor for data transfer in a master section and in a slave section for use as a dynamic shift register.

It is still another object of the present invention to provide a CMOS D-type flip-flop circuit having a single N-channel MOS transistor for data transfer in a master section and in a slave section for use as a static shift register.

It is yet still another object of the present invention to provide a CMOS D-type flip-flop circuit for use as an input data multiplexer.

It is still yet another object of the present invention to provide a CMOS D-type flip-flop circuit for receiving an output from a N-channel FET array.

In accordance with these aims and objectives, the present invention is concerned with the provision of a CMOS D-type flip-flop circuit which avoids the possibility of feedthrough which includes a non-overlapping clock generator section having a true clock output and a complement clock output. The flip-flop circuit includes a master section formed of a first transfer gate, a first regenerative transistor and a first inverter gate. The first transfer gate is formed of a first N-channel MOS transistor, and the regenerative transistor is formed of a first P-channel MOS transistor. The N-channel transistor has one of its common electrodes connected to a D input terminal, its other common electrode connected to the input of the first inverter gate and its gate electrode connected to the complement clock output. The first P-channel transistor has one of its common electrodes connected to a supply potential, its other common electrode connected to the input of the first inverter gate and its gate electrode connected to the output of the first inverter gate. The flip-flop circuit further includes a slave section formed of a second transfer gate, a second regenerative transistor and a second inverter gate. The second transfer gate is formed of a second N-channel MOS transistor, and the second regenerative transistor is formed of a second P-channel MOS transistor. The second N-channel transistor has one of its common electrodes connected to the output of the first inverter gate, its other common electrode connected to the input of the second inverter gate and its gate electrode connected to the true clock output. The second P-channel transistor has one of its common electrodes connected to the supply potential, its other common electrode connected to the input of the second inverter gate and its gate electrode connected to the output of the second inverter gate and to an output terminal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
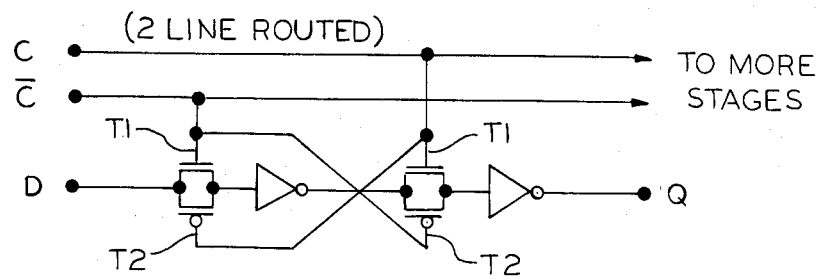
FIG. 1 is a schematic circuit diagram of a CMOS dynamic flip-flop circuit of the prior art.
Figure 2:
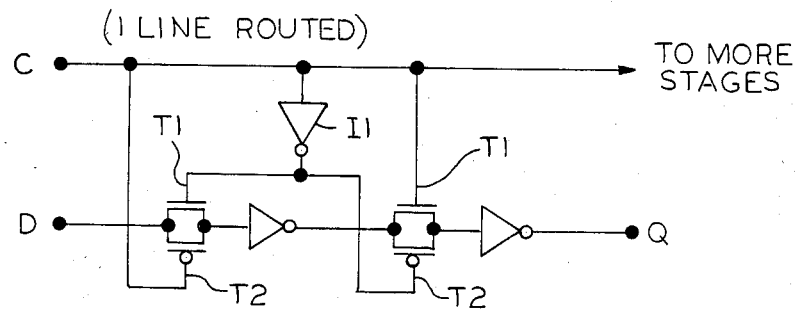
FIG. 2 is a schematic circuit diagram of an alternate embodiment of FIG. 1.
Figure 3:
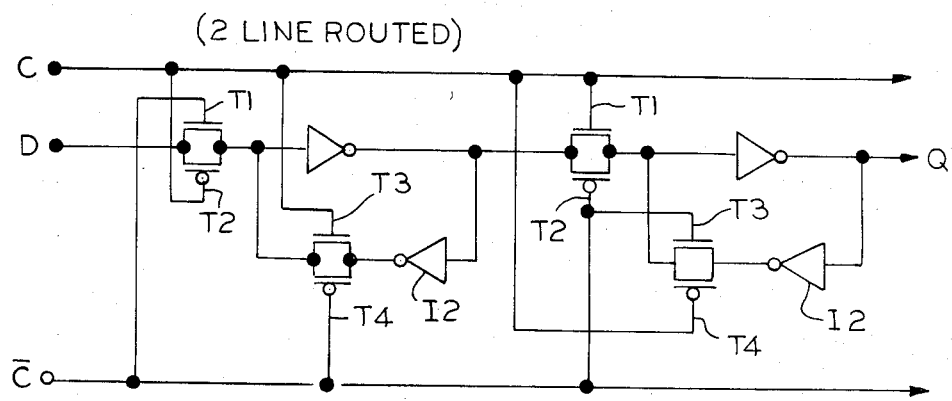
FIG. 3 is a schematic circuit diagram of a CMOS static flip-flop circuit of the prior art.
Figure 4:
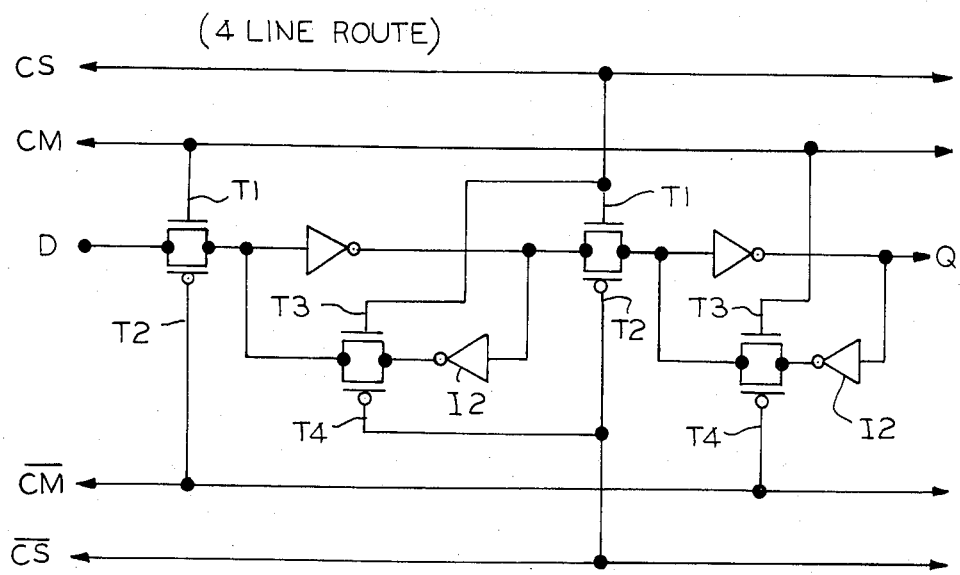
FIG. 4 is a schematic circuit diagram of an alternate embodiment of FIG. 3.
Figure 5:
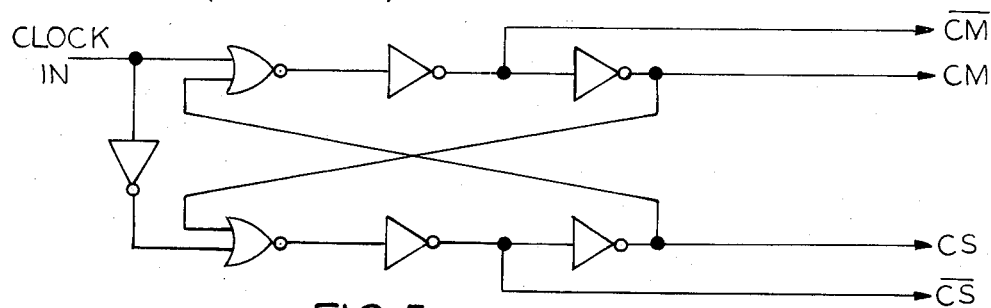
FIG. 5 is a schematic circuit diagram of a clock generator for use with the prior art flip-flop circuit of FIG. 4.
Figure 6:
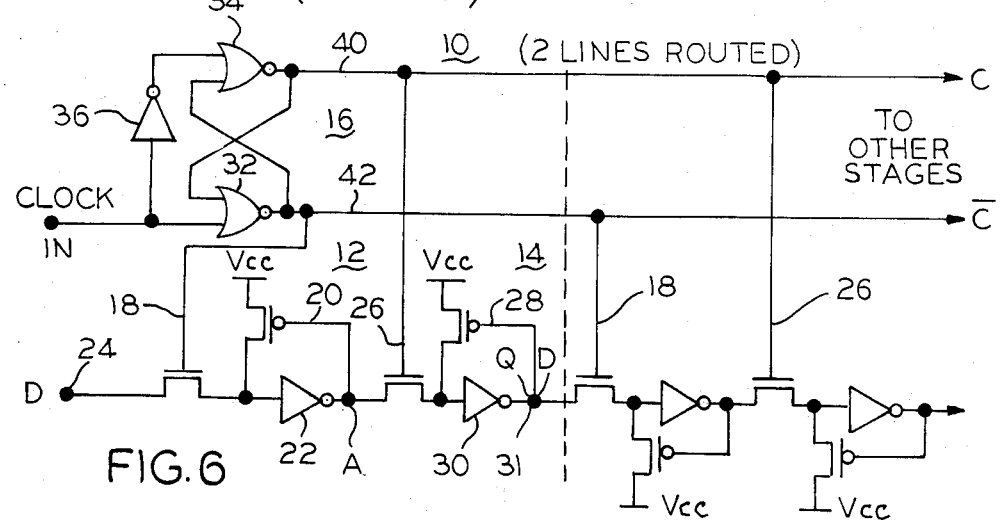
FIG. 6 is a schematic circuit diagram of a CMOS D-type dynamic flip-flop circuit, according to the present invention.

Referring now in detail to the various views of the drawings, there is shown in FIG. 6 a schematic circuit diagram of a CMOS D-type dynamic flip-flop circuit 10 of the present invention which is employed for use as a data or shift register stage. As used herein, the term "dynamic" refers to a clock generator which is continually changed between a high or logic "1" state and a low or logic "0" state. Thus, a dynamic flip-flop circuit is one which is adapted to receive such a clock generator. The flip-flop circuit 10 is formed of a master section 12, a slave section 14 and a clock generator section 16.

The master section 12 includes a transfer gate formed of a single N-channel MOS transistor 18, a regenerative transistor formed of a P-channel MOS transistor 20 and an inverter gate 22. One of the common electrodes such as the source electrode of the transistor 18 is connected to a D input terminal 24 for receiving data input signals. The drain electrode of the transistor 18 is connected to the source of the transistor 20 and to the input of the inverter gate 22. The gate electrode of the transistor 18 is connected to a first or false clock output signal $\overline{C}$ from the clock generator 16. The drain electrode of the transistor 20 is connected to a supply voltage or potential VCC. The gate electrode of the transistor 20 is connected to the output of the inverter gate 22 which is defined as the output of the master section 12.

The slave section 14 is identical in construction to the master section 12 and includes a transfer gate formed of a single N-channel MOS transistor 26, a regenerative transistor formed of a P-channel MOS transistor 28 and an inverter gate 30. The source electrode of the transistor 26 is connected to the output (node A) of the master section 12. The drain electrode of the transistor 26 is connected to the soruce of the transistor 28 and to the input of the inverter gate 30. The gate electrode of the transistor 26 is connected to a second or true clock signal C from the clock generator section 16. The drain electrode of transistor 28 is connected to the supply potential VCC. The gate electrode of the transistor 28 is connected to the output of the inverter gate 30 which is defined as the output of the slave section 14 or as the Q-output on output terminal 31 of the flip-flop circuit.

The regenerative transistor 20 in the master section serves to pull up the input to the transfer gate 18 so that the voltage at the output of the inverter gate 22 will be near the supply potential VCC. Typically, the supply potential VCC for CMOS circuits is +5 volts. Similarly, the regenerative transistor 28 in the slave section serves to pull up the input to the transfer gate 26 so that the output of the inverter gate 30 will also be near the supply potential VCC.

The clock generator section 16 is formed of a pair of NOR gates 32, 34 and an inverter gate 36. The first NOR gate 32 has its one input connected to an input terminal 38 for receiving a clock input signal and to the input of the inverter gate 36. The other input of the NOR gate 32 is connected to the output of the second NOR gate 34. The output of the NOR gate 32 is connected to a first input of the second NOR gate 34. The other input of the NOR gate 34 is connected to the output of the inverter gate 36. The output of the NOR gate 34 on line 40 provides a true clock output signal C, and the output of the NOR gate 32 on line 42 provides a false or complement clock output signal $\overline{C}$. These clock output signals $\overline{C}$ and C define the respective master and slave clock outputs of a two-phase non-overlapping clock generator wherein one of the outputs is in a low or logic "0" state and the other output is in a high or logic "1" state.

The complement clock output signal $\overline{C}$ is fed to the gate electrode of the transistor 18 in the master section 12. The true clock output signal C is fed to the gate electrode of the transistor 26 in the slave section 14. The master section and the slave section are connected together in the manner shown to form a first stage of the shift register. As can be seen, the complement clock output signal $\overline{C}$ is further connected to the gate electrode of the N-channel MOS transistor in each master section of the other successive stages. Similarly, the true clock output signal C is further connected to the gate electrode of the N-channel MOS transistor in each slave section of the other successive stages.

Figure 10:
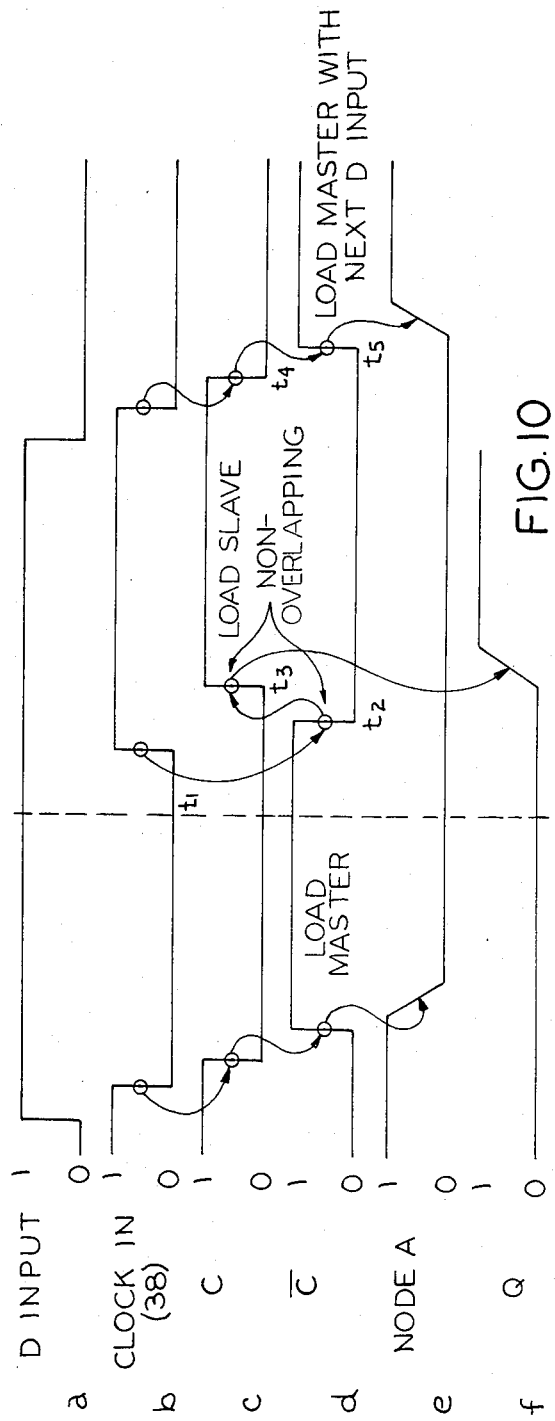
FIGS. 10(a) through 10(f) are a set of waveform diagrams useful for understanding the operation of the circuits in FIGS. 6, 7 and 8.

The operation of the flip-flop circuit 10 will now be explained with reference to the waveform diagrams shown in FIG. 10 which are useful in assisting in the further understanding of this operation. Assuming initially at time t1 that the clock input signal (FIG. 10b) is at a low level or logic "0" state, the complement output signal $\overline{C}$ (FIG. 10d) is at a high level or logic "1" state, and the true clock output signal C (FIG. 10c) is at a low level or logic "0" state. This causes the N-channel transistor 18 in the master section to be turned on and the N-channel transistor 26 in the slave section to be turned off. Thus, the state of the Q output on terminal 31 remains fixed or latched. Further, since the transistor 18 is turned on, the master section will have sampled the data input signal (FIG. 10a) which is assumed to be in a logic "1" state at time t1. The data input signal on the D input on terminal 24 will be transferred to the output or node A (FIG. 10e) of the master section immediately prior to the clock input signal making a transition. When the clock input signal makes a transition from the logic "0" state to a logic "1" state, the complement clock output signal $\overline{C}$ will be switched to a low level or logic "0" state while the true clock output signal C is still in the logic "0" state since the pull down transition in FET circuits is faster than the pull up transition. Thus, the transistor 18 will now be turned off so that the master section 12 will be latched to store the state of the D input or logic "1". This occurs at the time t2. Subsequently, the true clock output signal C will be switched at the time t3 to the logic "1" state at a short delay time after the complement clock output signal $\overline{C}$ has been already in the logic "0" state. Under this condition, the output of the master section 12 at node A will be transferred to the Q output (FIG. 10f) of the slave section 14 since the transistor 26 will be turned on.

When the clock input signal makes a transition from the logic "1" state to a logic "0" state, the true clock output signal C will be switched to a low level or logic "0" state while the complement clock output signal $\overline{C}$ is still in the logic "0" state due to the faster pull down action in the FET circuits. Thus, the transistor 26 will be turned off again so as to latch the output of the slave section 14, which is also the Q output of the flip-flop circuit. This occurs at the time t4. Subsequently, the complement clock output signal $\overline{C}$ will be switched at the time t5 to the logic "1" state at a short delay time after the true clock output signal C has been already in the logic "0" state. Under this condition, the next or new data input signal will be sampled and loaded or transferred to the node A of the master section. The new data input signal will now be ready for transfer to the slave section when the next clock input signal makes again a transition from the logic "0" state to the logic "1" state. A similar operation will occur in which the data input signal on the D inputs at the successive stages will be transferred to the respective Q outputs.

In view of this operation just described, it will be noted that at no time are both the transistor 18 in the master section and the transistor 26 in the slave section turned on simultaneously. Since both of the transistors are made to be in the non-conductive state before one of them is allowed to be rendered conductive this guarantees that there will be no inadvertent racethrough or feedthrough of the D input due to the overlapping of conduction of both transistors in the master and slave sections. Of course, if both the master and slave sections were rendered conductive simultaneously, the D input would ripple through the first stage and to all of the successive stages creating an erroneous reading in the shift register since the D input terminal in each successive stage is connected to the Q output of the preceding stage.

Figure 7:
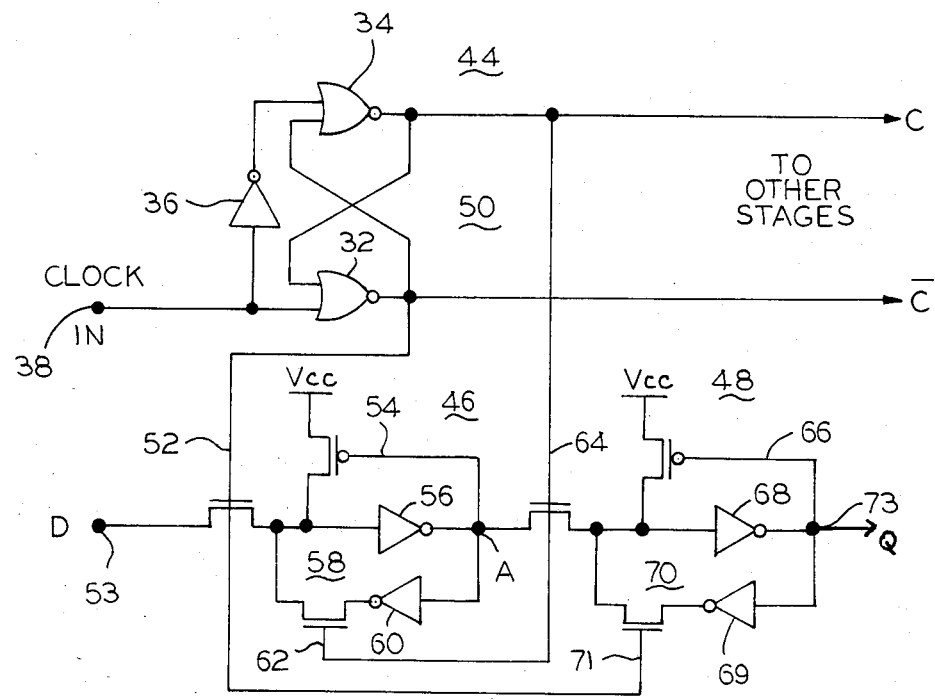
FIG. 7 is a schematic circuit diagram of a CMOS D-type static flip-flop circuit, according to the present invention.

In FIG. 7, there is illustrated a schematic circuit diagram of a CMOS static D-type flip-flop circuit 44 of the present invention. As used herein, the term "static" refers to a clock generator which can remain indefinitely either in the logic "1" state or logic "0" state. Thus, a static flip-flop is one which is adapted for receiving such a clock signal. The flip-flop circuit 44 is formed of a master section 46, a slave section 48 and a clock generator section 50.

The master section 46 includes a transfer gate formed of a single N-channel MOS transistor 52, a regenerative transistor formed of a P-channel MOS transistor 54, an inverter gate 56 and a regeneration circuit 58. The source electrode of the transistor 52 is connected to a D input terminal 53 for receiving data input signals. The drain electrode of the transistor 52 is connected to the source of the transistor 54 and to the input inverter gate 56. The gate of the transistor 52 is connected to a first or false clock output signal $\overline{C}$ from the clock generator 50. The drain electrode of the transistor 54 is connected to a supply voltage or potential VCC. The gate of the transistor 54 is connected to the output of the inverter gate 56 which is defined as the output of the master section 46.

The regeneration circuit 58 is formed of an inverter gate 60 and a N-channel MOS transistor 62. The input of the inventer gate 60 is connected to the output of the master section which is at the output of the inverter gate 56 or node A. The source of the transistor 62 is connected to the output of the inverter gate 60. The drain of the transistor 62 is connected to the input of the inverter gate 56. The gate electrode of the transistor 62 is connected to a second or true clock output signal C from the clock generator section 50. The input of the inverter gate 60 defines a first input of the regeneration circuit 58, and the gate electrode of the transistor 62 defines a second input of the circuit 58. The drain of the transistor 62 defines an output of the circuit 58.

The slave section 48 is identical in construction to the master section and comprises a transfer gate formed of a single N-channel MOS transistor 64, a regenerative transistor formed of a P-channel MOS transistor 66, an inventer gate 68 and a regeneration circuit 70. The source electrode of the transistor 64 is connected to the output (node A) of the master section 46. The drain electrode of the transistor 64 is connected to the source of the transistor 66 and to the input of the inverter gate 68. The gate electrode of the transistor 64 is connected to the second or true clock output signal C from the clock generator section 50. The drain electrode of the transistor 66 is connected to the supply potential VCC. The gate electrode of the transistor 66 is connected to the output of the inverter gate 68 which is defined as the output of the slave section 48 or as the Q output on output terminal 73 of the flip-flop circuit.

The regeneration circuit 70 is formed of an inverter gate 69 and a N-channel MOS transistor 71. The input of the inverter gate 69 is connected to the output of the slave section which is at the output of the inverter gate 68 or the Q output on the terminal 73. The source of the transistor 71 is connected to the output of the inverter gate 69. The drain electrode of the transistor 71 is connected to the input of the inverter gate 68. The gate electrode of the transistor 71 is connected to the false clock output signal $\overline{C}$ from the clock generator circuit section 50. The input of the inverter gate 69 defines a first input of the regeneration circuit 70, and the gate electrode of the transistor 71 defines a second input of the circuit 70. The drain of the transistor 71 defines an output of the circuit 70.

The clock generator section 50 is identical to the clock generator section 16 of FIG. 6. Thus, no further description of the components and their operation is deemed to be necessary. However, it should be noted that this is a static clock generator where the clock input signal on the terminal 38 may remain in either the high state or the low state indefinitely. Therefore, the true clock output signal C will remain in a high or low state indefinitely. The complement or false clock output signal $\overline{C}$ will assume the opposite state to the true clock output C.

Assuming that the true clock output signal C is in the high state, the N-channel transistor 62 in the regeneration circuit 58 of the master section 46 will be turned on and the transistor 71 in the slave section 48 will be turned off. With the transistor 62 being turned on, the output of the inverter gate 56 in the master section will be sent back to its input through the inverter gate 60 and the transistor 62 so as to cause latching thereof. On the other hand, assuming that the complement clock output signal $\overline{C}$ is in the high state, the N-channel transistor 71 in the regeneration circuit 70 of the slave section 48 will be turned on and the transistor 62 in the master section will be turned off. With the transistor 71 being turned on, the output of the inverter gate 68 in the slave section will be fed back to its input through the inverter gate 69 and the transistor 71 so as to cause latching thereof. When the clock input signal is caused to make a transition from the low state to the high state and vice versa, the operation of the flip-flop circuit 44 will be identical to the flip-flop circuit 10 of FIG. 6 which was illustrated in FIGS. 10(a) through (f).

Figure 8:
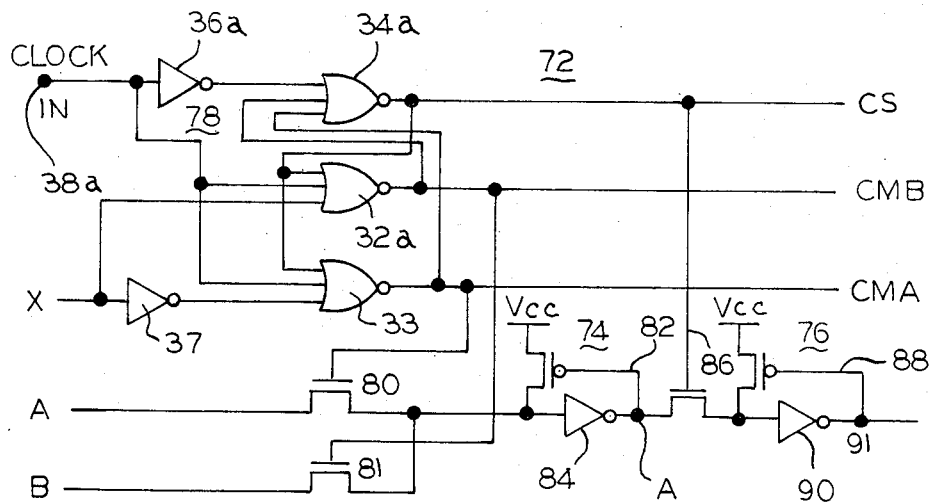
FIG. 8 is a schematic circuit diagram of a CMOS D-type flip-flop circuit of the present invention for use as an input data multiplexer.

Referring now to FIG. 8 of the drawing, there is shown a schematic circuit diagram of a CMOS D-type flip-flop circuit 72 of the present invention which is employed for use as an input data multiplexer. The flip-flop circuit is formed of a master section 74, a slave section 76 and a clock generator section 78.

The master section 74 consists of a plurality of multiplexed data input transistor each formed of a N-channel MOS transistor 80, 81, a regenerative transistor formed of a P-channel MOS transistor 82 and an inverter gate 84. The source electrode of the transistor 80 is connected to an input data terminal for receiving data signal A. The drain electrode of the transistor 80 is connected to a source of the transistor 82 and to the input of the inverter gate 84. The gate electrode of the transistor 80 is connected to a first master clock output signal CMA from the clock generator section 78. The drain electrode of the transistor 82 is connected to a supply voltage or potential VCC. The gate electrode of the transistor 82 is connected to the output of the inverter gate 84 which is defined as the output of the master section 74. The transistor 81 is connected similarly to the transistor 80. The source electrode of the transistor 81 is connected to an input data terminal for receiving data signal B. The drain electrode of the transistor 81 is connected to the drain of the transistor 80. The gate electrode of the transistor 81 is connected to the second master clock output signal CMB of the clock generator circuit section 78. While only two data input transistors have been shown, it should be clearly understood that a number of additional transistors could be similarly connected.

The slave section 76 consists of a transfer gate formed of a single N-channel MOS transistor 86, a regenerative transistor 88 and an inverter gate 90. The source electrode of the transistor 86 is connected to the output (node A) of the master section 74. The drain of the transistor 86 is connected to the source of the transistor 88 and to the input of the inverter gate 90. The gate electrode of the transistor 86 is connected to a slave clock output signal CS from the clock generator section 78. The drain electrode of the transistor 88 is connected to the supply potential VCC. A gate of the transistor 88 is connected to the output of the inverter gate 90 which is defined as the output of the slave section 76 or as output terminal 91 of the flip-flop circuit.

The clock generator section 78 is a slightly modified, version of the clock generator section 16 and comprises three NOR gates 32a, 34a, 33 and two inverter gates 36a, 37. The NOR gates 32a and 33 each have one of its inputs connected to an input terminal 38a for receiving a clock input signal and to the input of the inverter gate 36a. A second input of each NOR gates 32a and 33 is connected to the output of the NOR gate 34a. The third input of the NOR gate 32a is connected to a control signal X for selecting either data signal A or data signal B. The control signal X is fed to the input of the inverter 37 whose output is joined to the third input the NOR gate 33. The outputs of the inverter gate 36a, the NOR gate 32a, and the NOR gate 33 are the three inputs to the NOR gate 34a.

The output of the NOR gate 34a defines the slave clock output and is fed to the gate electrode of the transistor 86 in the slave section 76. The output of the NOR gate 33 defines the first master clock output and is fed to the gate electrode of data input transistor 80. The output of the NOR gate 32a defines the second master clock output and is fed to the gate electrode of data input transistor 81. Except for these differences in the clock generator 78, the manner and operation of the flip-flop circuit 72 in transferring either the selected data signal A or data signal B dependent upon the control signal X will be identical to what was previously explained in connection with FIGS. 6 and 10(a) through (f).

Figure 9:
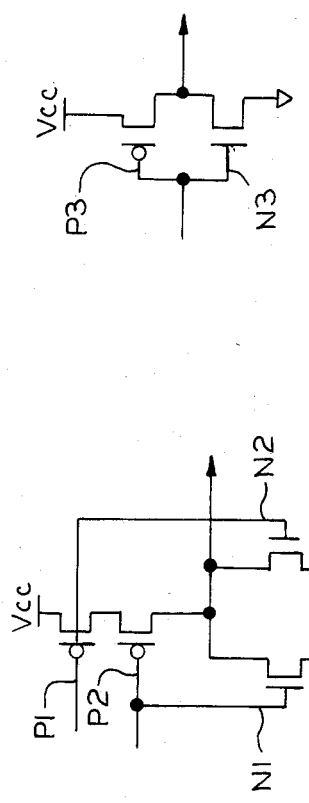
FIGS. 9(a) and 9(b) are schematic circuit diagrams of the logical representations of the respective NOR and inverter gates depicted in FIGS. 1 through 8.

In the circuits of FIGS. 6, 7 and 8 it should be understood that the source and drain designations for all of the field-effect transistors could be interchanged. In other words, in each instance, the source electrode could be replaced by the drain electrode and the drain electrode replaced by the source electrode. Further, the details of the logical representations of the NOR gates and inverter gates in FIGS. 6, 7 and 8 are illustrated in FIGS. 9(a) and 9(b). As can be seen, the NOR gate of FIG. 9(a) is formed of a pair of P-channel MOS transistors P1, P2 and a pair of N-channel MOS transistors N1, N2. The inverter gate of FIG. 9(b) is formed of a P-channel MOS transistor P3 and a N-channel MOS transistor N3. It should be apparent to those skilled in the art that the N-channel transistor could be replaced by a P-channel transistor and vice versa in the master and slave sections of FIGS. 6, 7 and 8.

The flip-flop circuits of the present invention have following advantages over the prior art designs:

(a) they enable the use of a standard non-overlapping clock generator without the possibility of racethrough;

(b) they allow additional stages to be added in a simple manner without substantial regard to loading of the clock generator;

(c) they permit the use of fewer component elements and fewer lead connections which simplifies routing; and (d) they simplify design layout on an integrated substrate by allowing fewer signals to cross the "well boundary" (from the N-channel FET area to the P-channel FET area) since this is a relatively long distance to cross in a diode-isolated CMOS process.

From the foregoing detailed description, it can thus be seen that the present invention provides an improved CMOS D-type flip-flop circuit which avoids the possibility of feedthrough. A single N-channel MOS transistor is used as a transfer gate in a master section and in a slave section which permits the use of a two-phase non-overlapping clock generator.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention, but that the invention will include all embodiments falling within the scope of the appended claims.

What is claimed is:

1. A CMOS D-type flip-flop circuit for avoiding the possibility of feedthrough comprising:
   a non-overlapping clock generator section having a true clock output and a complement clock output;
   a master section formed of a first transfer gate, a first regenerative transistor and a first inverter gate;
   said first transfer gate being formed of a first N-channel MOS transistor with common electrodes and a gate electrode, and said first regenerative transistor being formed of a first P-channel MOS transistor with common electrodes and a gate electrode;
   said first N-channel transistor having one of its common electrodes connected to a D input terminal, its other common electrode connected to the input of said first inverter gate and its gate electrode connected to the complement clock output;
   said first P-channel transistor having one of its common electrodes connected to a supply potential, its other common electrode connected to the input of said first inverter gate, and its gate electrode connected to the output of said first inverter gate;
   said first inverter gate being formed of a P-channel MOS transistor and an N-channel MOS transistor whose gate electrodes are connected together to define the input thereof and whose drain electrodes are connected together to define the output thereof;
   a slave section formed of a second transfer gate, a second regenerative transistor and a second inverter gate;
   said second transfer gate being formed of a second N-channel MOS transistor with common electrodes and a gate electrode, and said second regenerative transistor being formed of a second P-channel MOS transistor with common electrodes and a gate electrode;
   said second N-channel transistor having one of its common electrodes connected to the output of said first inverter gate, its other common electrode connected to the input of said second inverter gate and its gate electrode connected to the true clock output;
   said second P-channel transistor having one of its common electrodes connected to the supply potential, its other common electrode connected to the input of said second inverter gate and its gate electrode connected to the output of said second inverter gate and to an output terminal;
   said second inverter gate being formed of a P-channel MOS transistor and an N-channel MOS transistor whose gate electrodes are connected together to define the input thereof and whose drain electrodes are connected together to define the output thereof;
   a first regeneration circuit formed of a third inverter gate and a third N-channel MOS transistor with common electrodes and a gate electrode;
   said third N-channel transistor having one of its common electrodes connected to the output of said third inverter gate, its other common electrode connected to the input of said first inverter gate and its gate electrode connected to the true clock output, the input of said third inverter gate being connected to the output of said first inverter gate;
   a second regeneration circuit formed of a fourth inverter gate and a fourth N-channel MOS transistor with common electrodes and a gate electrode; and
   said fourth N-channel transistor having one of its common electrodes connected to the output of said fourth inverter gate, its other common electrode connected to the input of said second inverter gate and its gate electrode connected to the complementary clock output, the input of said fourth inverter gate being connected to the output of said second inverter gate.

2. A flip-flop circuit as claimed in claim 1, wherein said master section and said slave section define a first stage of a shift register.

3. A flip-flop circuit as claimed in claim 2, further comprising a plurality of successive stages being connected to said first stage.

4. A flip-flop circuit as claimed in claim 3, wherein the D input terminal of each successive stage is connected to said output terminal of the preceding stage, the complement clock output is connected to each gate electrode of said N-channel transistor of said master section, and the true clock output is connected to each gate electrode of said N-channel transistor of said slave section.

5. A flip-flop circuit as claimed in claim 1, wherein said clock generator section is formed of a pair of NOR gates and a third inverter gate.

6. A flip-flop circuit as claimed in claim 5, wherein said NOR gates consist of a pair of P-channel MOS transistors and a pair of N-channel MOS transistors.

7. A flip-flop circuit as claimed in claim 1, wherein said one common electrode comprises a source electrode and said other common electrode comprises a drain electrode.

8. A flip-flop circuit as claimed in claim 1, wherein said one common electrode comprises a drain electrode and said other common electrode comprises a source electrode.

* * * * *